US00RE50353E

(19) United States
(12) Reissued Patent
Meyvaert et al.

(10) Patent Number: US RE50,353 E
(45) Date of Reissued Patent: Mar. 25, 2025

(54) CIRCUITS AND METHODS FOR HYBRID 3:1 VOLTAGE REGULATORS

(71) Applicant: Lion Semiconductor Inc., Austin, TX (US)

(72) Inventors: Hans Meyvaert, Leuven (BE); Zhipeng Li, Fremont, CA (US); Alberto Alessandro Angelo Puggelli, Cupertino, CA (US); Thomas Li, Mountain View, CA (US)

(73) Assignee: Lion Semiconductor Inc., Austin, TX (US)

(21) Appl. No.: 17/696,379

(22) Filed: Mar. 16, 2022

Related U.S. Patent Documents

Reissue of:

(64) Patent No.: 10,601,311
Issued: Mar. 24, 2020
Appl. No.: 15/895,893
Filed: Feb. 13, 2018

(51) Int. Cl.
*H02M 3/07* (2006.01)
*G11C 5/14* (2006.01)

(52) U.S. Cl.
CPC ..... *H02M 3/07* (2013.01); *G11C 5/145* (2013.01); *H02M 3/073* (2013.01)

(58) Field of Classification Search
CPC ..... H02M 3/07; H02M 3/073; H02M 7/06; H02M 7/10; H02M 7/19; H02M 7/25; G11C 5/145
USPC ..... 363/59–61; 327/534–543
See application file for complete search history.

(56) References Cited

U.S. PATENT DOCUMENTS

| | | | |
|---|---|---|---|
| 5,959,853 | A | 9/1999 | Kos |
| 6,055,168 | A | 4/2000 | Kotowski et al. |
| 6,169,392 | B1 | 1/2001 | Kitagawa |
| 6,317,343 | B1 | 11/2001 | Okamura et al. |
| 6,411,531 | B1 | 6/2002 | Nork et al. |

(Continued)

FOREIGN PATENT DOCUMENTS

| | | |
|---|---|---|
| CN | 1700572 | 11/2005 |
| CN | 101340145 | 1/2009 |

(Continued)

OTHER PUBLICATIONS

International Preliminary Report on Patentability dated Aug. 18, 2020 in Internation Patent Application No. PCT/US2019/017654, pp. 1-6.

(Continued)

*Primary Examiner* — My Trang Ton
(74) *Attorney, Agent, or Firm* — Byrne Poh LLP

(57) ABSTRACT

Circuits for a voltage regulator are provided, comprising: an inductor having a first side coupled to an input voltage; a first flying capacitor; a second flying capacitor; and a plurality of switches, wherein: in a first state, the plurality of switches couple: a second side of the inductor to a second side of the first flying capacitor and an output node; a first side of the first flying capacitor to a first side of the second flying capacitor; and a second side of the second flying capacitor to a voltage supply, in a second state, the plurality of switches couple: the second side of the inductor to the first side of the second flying capacitor; the second side of the second flying capacitor to the output node and the first side of the first flying capacitor; and the second side of the first flying capacitor to the voltage supply.

26 Claims, 5 Drawing Sheets

(56) References Cited

U.S. PATENT DOCUMENTS

| | | | | |
|---|---|---|---|---|
| 6,429,632 | B1 * | 8/2002 | Forbes | H02M 3/07 363/59 |
| 7,782,027 | B2 | 8/2010 | Williams | |
| 7,990,741 | B2 | 8/2011 | Martinussen | |
| 9,831,776 | B1 * | 11/2017 | Jiang | H02M 1/15 |
| 10,141,844 | B2 * | 11/2018 | Le | H02M 3/003 |
| 2003/0007373 | A1 | 1/2003 | Satoh | |
| 2007/0052471 | A1 | 3/2007 | Ng | |
| 2007/0139982 | A1 | 6/2007 | Ueno et al. | |
| 2008/0157732 | A1 | 7/2008 | Williams | |
| 2008/0157733 | A1 | 7/2008 | Williams | |
| 2008/0158915 | A1 | 7/2008 | Williams | |
| 2008/0238390 | A1 | 10/2008 | Trivedi et al. | |
| 2009/0058363 | A1 | 3/2009 | Platania et al. | |
| 2009/0059630 | A1 | 3/2009 | Williams | |
| 2009/0206804 | A1 | 8/2009 | Xu et al. | |
| 2009/0315615 | A1 * | 12/2009 | Likhterov | H02M 3/07 327/536 |
| 2011/0221482 | A1 | 9/2011 | Kim et al. | |
| 2012/0284541 | A1 | 11/2012 | Dennard et al. | |
| 2014/0071721 | A1 * | 3/2014 | Verma | H02M 3/07 363/59 |
| 2014/0306673 | A1 * | 10/2014 | Le | H02M 3/158 323/266 |
| 2017/0324329 | A1 * | 11/2017 | Zhang | H02J 3/383 |
| 2018/0358896 | A1 * | 12/2018 | Puggelli | H02M 3/158 |

FOREIGN PATENT DOCUMENTS

| | | |
|---|---|---|
| CN | 101647181 | 2/2010 |
| CN | 104167918 A | 11/2014 |
| EP | 2493060 | 8/2012 |
| JP | 1972043944 | 4/1972 |
| JP | 2000124770 | 4/2000 |
| JP | 2007336698 | 12/2007 |
| JP | 2009017772 | 1/2009 |
| JP | 2010515419 | 5/2010 |
| JP | 2013065939 | 4/2013 |
| WO | WO 2008/082581 | 7/2008 |
| WO | WO 2010130588 | 11/2010 |
| WO | WO 2012151466 | 11/2012 |
| WO | WO 2016/168019 | 9/2016 |

OTHER PUBLICATIONS

International Search Report and Written Opinion dated Mar. 14, 2019 in International Patent Application No. PCT/US2019/017654, pp. 1-8.

International Search Report and Written Opinion dated Apr. 2, 2015 in International Patent Application No. PCT/US2014/033759, pp. 1-18.

Kim, W., et al., "A Fully Integrated 3-Level DC-DC Converter for Nonsecond-Scale DVFS", In IEEE Journal of Solid-State Circuits, vol. 47, No. 1, Jan. 2012, pp. 206-219.

Kim, W., et al., "System Level Analysis of Fast, Per-Core DVFS Using On-Chip Switching Regulators", In IEEE International Symposium of High-Performance Computer Architecture (HPCA), Feb. 2008, pp. 1-12.

Le, H.-P., et al., "Design Techniques for Fully Integrated Switched-Capacitor DC-DC Converters", in IEEE Journal of Solid-State Circuits, vol. 46, No. 9, Sep. 2011, pp. 2120-2131.

Notice of Allowance dated Apr. 6, 2020 in KR Patent Application No. 10-2015-7032080, pp. 1-10.

Notice of Allowance dated May 7, 2018 in U.S. Appl. No. 14/250,990, pp. 1-14.

Notice of Allowance dated Jul. 28, 2015 in U.S. Appl. No. 14/250,970, pp. 1-22.

Notice of Allowance dated Nov. 4, 2019 in U.S. Appl. No. 15/895,893, pp. 1-28.

Notice of Allowance dated Dec. 14, 2021 in CN Patent Application No. 201980009395.2, pp. 1-2.

Notice of Allowance dated Dec. 21, 2017 in U.S. Appl. No. 14/250,990, pp. 1-14.

Office Action dated Feb. 13, 2018 in JP Patent Application No. 2016-507679, pp. 1-6.

Office Action dated Apr. 6, 2021 in CN Patent Application No. 201980009395.2, pp. 1-8.

Office Action dated Apr. 19, 2017 in U.S. Appl. No. 14/250,990, pp. 1-25.

Office Action dated May 29, 2019 in U.S. Appl. No. 15/895,893, pp. 1-20.

Office Action dated Jul. 27, 2018 in U.S. Appl. No. 15/895,893, pp. 1-14.

Office Action dated Aug. 1, 2017 in CN Application No. 201480033624.1, pp. 1-27.

Office Action dated Aug. 9, 2019 in KR Patent Application No. 10-2015-7032080, pp. 1-10.

Office Action dated Oct. 5, 2018 in EP Patent Application No. 14729122.3, pp. 1-4.

Office Action dated Oct. 12, 2016 in U.S. Appl. No. 14/250,990, pp. 1-24.

Office Action dated Nov. 27, 2018 in U.S. Appl. No. 15/895,893, pp. 1-12.

* cited by examiner

CIRCUITS AND METHODS FOR HYBRID 3:1 VOLTAGE REGULATORS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*The present reissue application is a reissue application of U.S. patent application Ser. No. 15/895,893, filed Feb. 13, 2018, now U.S. Pat. No. 10,601,311.*

BACKGROUND

Hybrid regulators have several advantages compared to buck regulators and Switched-Capacitor (SC) regulators. Hybrid regulators can be more efficient and can use smaller inductors than buck regulators. Hybrid regulators can efficiently regulate across a wider range of input to output voltage ratios. In contrast, SC regulator efficiency is high at N:M input to output voltage ratios (where N, M are integers), but efficiency drops as the ratio deviates from N:M to non-integer ratios.

Hybrid regulators can operate with multiple operating modes to support a wide range of input to output voltage ratios. For example, in a H21 mode, a hybrid regulator can support an input to output ($V_{IN}$:$V_{OUT}$) ratio between 2:1 and 1:1. As another example, in a H32 mode, a hybrid regulator can support a $V_{IN}$:$V_{OUT}$ ratio between 3:1 and 2:1. FIGS. 1A-1C show an example of a single hybrid regulator operating in a H32 mode and FIGS. 2A-2C show an example of a single hybrid regulator operating in a H21 mode. In FIGS. 1A-1C, the $V_{IN}$:$V_{OUT}$ ratio can be between 2:1 and 3:1. In FIGS. 2A-2C, the $V_{IN}$:$V_{OUT}$ ratio can be between 1:1 and 2:1. The hybrid regulator in FIGS. 1A-1C and 2A-2C can switch between these two modes (i.e., the H32 mode and the H21 mode) by changing which switches are turned on and off.

The upside of having multiple operating modes is that it enables a single regulator to support a wide range of $V_{IN}$:$V_{OUT}$ ratios, which can help cover a wide range of end applications with a single product. There are two downsides of having multiple modes. First, the regulator can require an additional feedback control that determines which mode to operate in. Second, there can be glitches while transitioning from one mode to another that can cause malfunction of the regulator. Different modes require different switches to turn on/off. If the timing of the switch activity is misaligned, some voltages on certain switches could be wrong, and a high voltage applied to a switch could break it. If surrounding conditions, such as input voltage or output current, change quickly, the regulator might need to change modes quickly, which can require very fast feedback control to change modes quickly (which feedback control can be challenging to design) and/or cause glitches during quick mode transition if all the timing requirements of related signals are not properly aligned (which proper alignment can be challenging to guarantee). For example, a hybrid regulator might be operating at 1.8V input and 1V output in H21 mode, and due to a system requirement, the input might need to quickly change to 2.5V, at which time the regulator needs to quickly change to H32 mode.

Accordingly, it is desirable to support a wider range of $V_{IN}$:$V_{OUT}$ ratios with as few modes as possible.

SUMMARY

In accordance with some embodiments, circuits and methods for hybrid 3:1 voltage regulators are provided. More particularly, in some embodiments, circuits for a voltage regulator are provided, the circuits comprising: an inductor having a first side coupled to an input voltage and having a second side; a first flying capacitor having a first side and having a second side; a second flying capacitor having a first side and having a second side; and a plurality of switches, wherein: in a first state, the plurality of switches couple: the second side of the inductor to a second side of the first flying capacitor and an output node; the first side of the first flying capacitor to the first side of the second flying capacitor; and the second side of the second flying capacitor to a voltage supply, in a second state, the plurality of switches couple: the second side of the inductor to a first side of the second flying capacitor; the second side of the second flying capacitor to the output node and the first side of the first flying capacitor; and the second side of the first flying capacitor to the voltage supply. In some of these circuits, the voltage supply is a ground. In some of these circuits, each switch is a MOSFET. In some of these circuits, a controller that controls the switches to switch between the first state and the second state is also provided. In some of these circuits, an output capacitor is also provided In some embodiments, circuits for a voltage regulator are provided, the circuits comprising: an inductor having a first side coupled to an input voltage and having a second side; a first switch having a first side coupled to the second side of the inductor and having a second side; a second switch having a first side coupled to the second side of the inductor and having a second side; and a reconfigurable SC regulator having a first input corresponding to a first VIN:VOUT ratio and having a second input corresponding to a second VIN:VOUT ratio, wherein the first input of the reconfigurable SC regulator is coupled to the second side of the first switch and wherein the second input of the reconfigurable SC regulator is coupled to the second side of the second switch.

DETAILED DESCRIPTION

In accordance with some embodiments, circuits and methods for hybrid 3:1 voltage regulators are provided. In some embodiments, hybrid 3:1 (H31) voltage regulators can support any $V_{IN}$:$V_{OUT}$ ratios between 3:1 and 1:1 with a single H31 mode. This is an improvement over prior hybrid regulators which need two modes, H32 and H21, to support $V_{IN}$:$V_{OUT}$ ratios between 3:1 and 1:1.

Figure 1B:
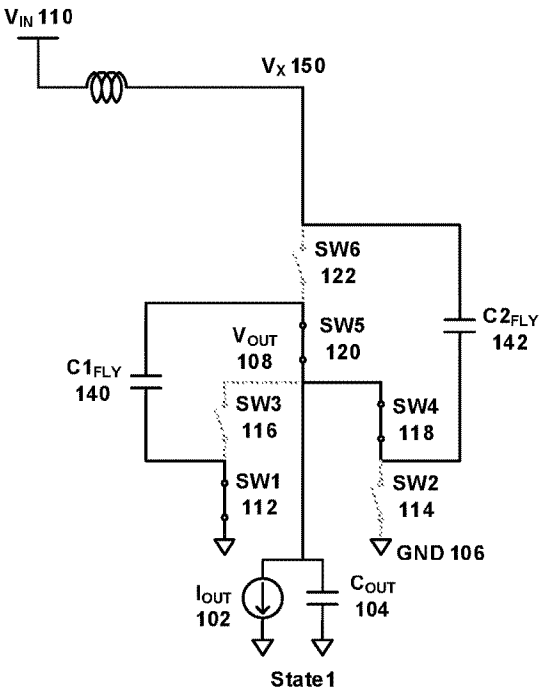
FIG. 1B (Prior Art)
FIGS. 1A and 1B are examples of schematics of a hybrid voltage regulator in a H32 mode as known in the prior art.
Figure 1A:
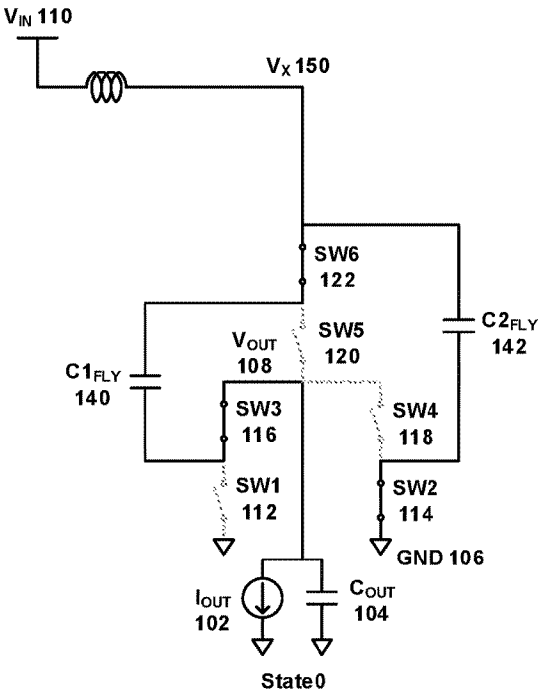
FIG. 1A (Prior Art)
Figure 1C:
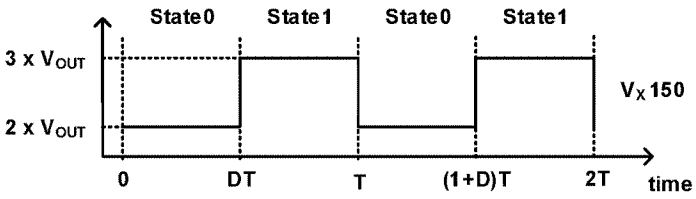
FIG. 1C (Prior Art)
FIG. 1C is an example of a timing diagram of a hybrid voltage regulator in a H32 mode as known in the prior art.
Figure 2A:
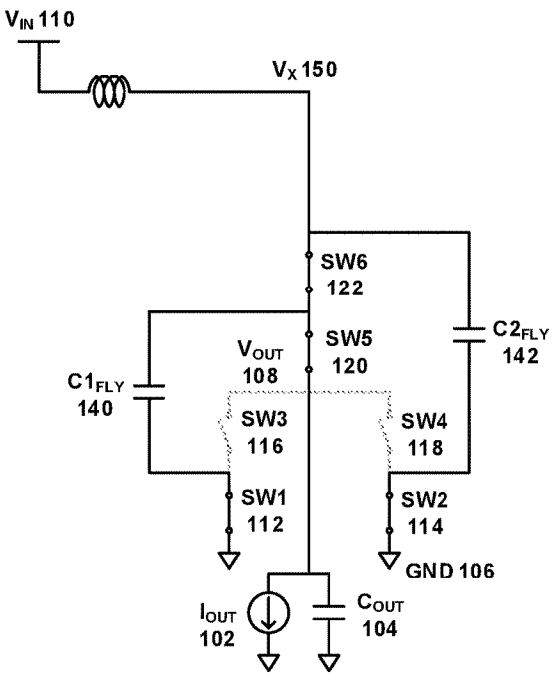
FIG. 2A (Prior Art)
FIGS. 2A and 2B are examples of schematics of a hybrid voltage regulator in a H21 mode as known in the prior art.
Figure 2B:
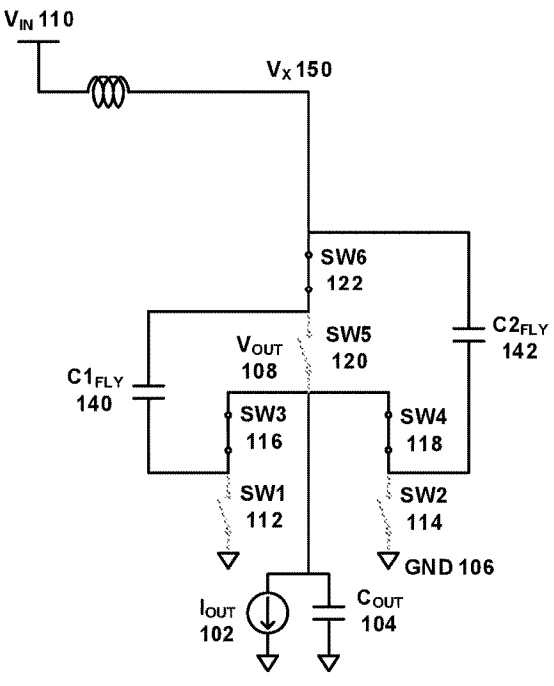
FIG. 2B (Prior Art)
Figure 2C:
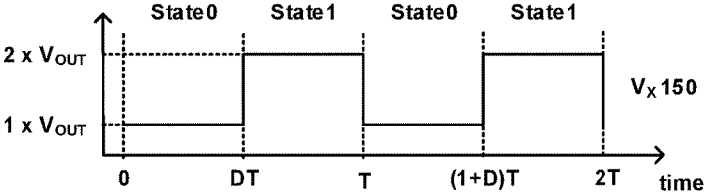
FIG. 2C (Prior Art)
FIG. 2C is an example of a timing diagram of a hybrid voltage regulator in a H21 mode as known in the prior art.
Figure 3A:
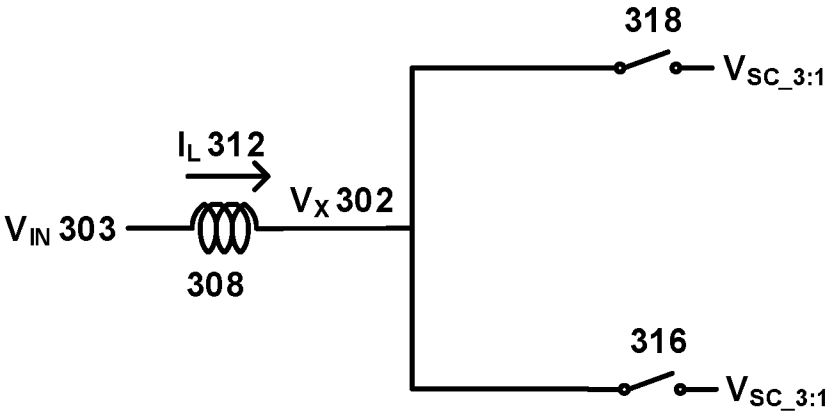
FIG. 3A is an example of a schematic of a portion of a hybrid voltage regulator having a H31 mode using a known reconfigurable 3:1, 1:1 switched capacitor regulator in accordance with some embodiments.
Figure 3B:
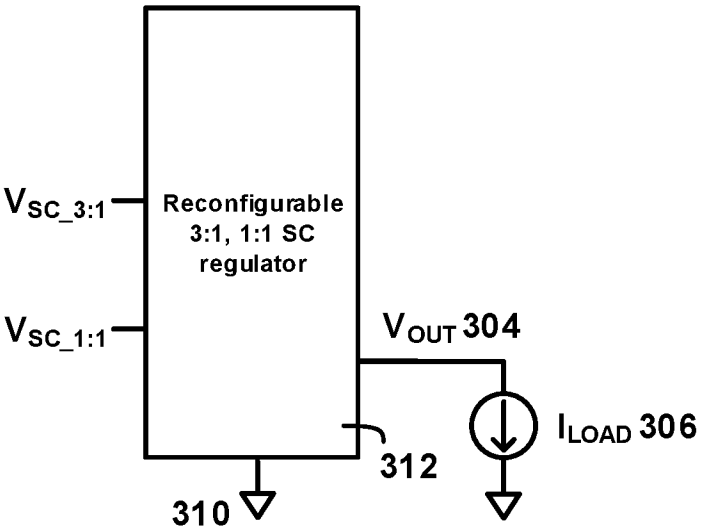
FIG. 3B is an example of a schematic of another portion of a hybrid voltage regulator having a H31 mode using a known reconfigurable 3:1, 1:1 switched capacitor regulator in accordance with some embodiments.
Figure 3C:
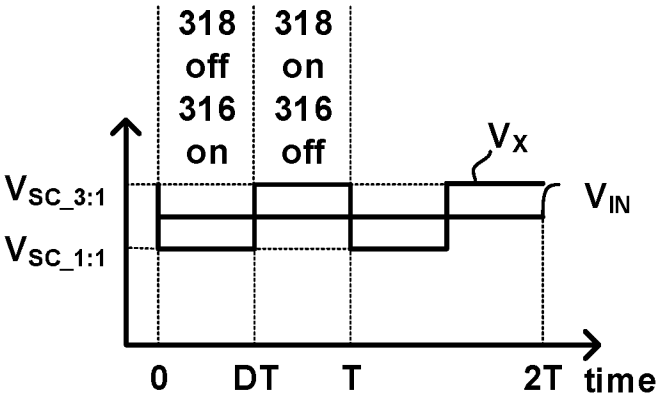
FIG. 3C is an example of a timing diagram of the hybrid voltage regulator of FIGS. 3A and 3B in accordance with some embodiments.

FIGS. 3A-3C illustrate an example of a H31 voltage regulator that can be implemented using an existing reconfigurable 3:1, 1:1 SC regulator, in accordance with some embodiments. As shown, this regulator includes an inductor 308, switches 318 and 316, and a reconfigurable 3:1, 1:1 SC regulator 312. This regulator can also include a controller (not shown) for controlling switches 318 and 316.

Inductor 318 can be any suitable inductor, such as a discrete inductor mounted on or embedded in a package or a printed circuit board (e.g., an inductor sized 0201, 0402, 0603, 0805 and so on) or a spiral inductor that can be drawn using metal layers on-chip, on-package, or on a printed circuit board. Switches 318 and 316 can be any suitable switches, such as MOSFETs. Reconfigurable 3:1, 1:1 SC regulator 312 (FIG. 3B) can be any suitable reconfigurable 3:1/1:1 SC regulator (e.g., such as a ladder regulator, a series/parallel regulator, a Dickson Star regulator, etc.).

During operation, a voltage $V_{IN}$ 303 from an input source can be provided to inductor 308. A current $I_L$ 312 passes through inductor 308 and a voltage $V_X$ 302 is present at the output (right) side of inductor 308. One of switch 318 and 316 connect $V_X$ 302 to $V_{SC_3:1}$ or $V_{SC_1:1}$. $V_{SC_3:1}$ is close to $3\times V_{OUT}$ 304, and $V_{SC_1:1}$ is close to $1\times V_{OUT}$ 304. Switches 318 and 316 can be turned on/off to make $V_X$ 302 switch between $3\times V_{OUT}$ 304 and $1\times V_{OUT}$ 304. In a steady state, the voltage across inductor 308 (i.e., $V_{IN}$ 303-$V_X$ 302) should be zero in average. Regulator 312 produces an output current $I_{LOAD}$ 306 that can be provided to any suitable load. Regulator 312 is also connected to a ground 310.

FIG. 3C shows a timing diagram of the H31 voltage regulator in accordance with some embodiments. As illustrated, from time 0 to time DT, switch 318 is off and switch 316 is on. During this time, $V_X$ 302 is connected to $V_{SC_1:1}$. From time DT to time T, switch 318 is on and switch 316 is off. During this time, $V_X$ 302 is connected to $V_{SC_3:1}$. As shown by line $V_{IN}$ in FIG. 3C, $V_{IN}$ equals the average of $V_X$. More particularly, $V_{IN}$ can be determined using the following equation:

$$V_{IN} = D\times V_{OUT} + (1-D)\times 3\times V_{OUT}$$
$$= 3\times V_{OUT} - 2\times D\times V_{OUT}$$
$$= V_{OUT}(3-2D)$$

where D is the duty cycle of the timing diagram in FIG. 3C and has value between 0 and 1, $V_{IN}$ is between $V_{OUT}$ and $3\times V_{OUT}$, which means that the $V_{IN}$:$V_{OUT}$ ratio is between 3:1 and 1:1.

Because the circuit of FIGS. 3A-3C uses switches 318 and 316 that are separate from the switches in SC regulator 312, the switching frequency and duty cycle for SC regulator 312 and the switching frequency and duty cycle for 318 and 316 (inductor switches) can be completely decoupled in some embodiments. A benefit of this is that the SC part and inductor part can be optimized for maximum efficiency. For example, the SC part can switch at 50% duty cycle (which is usually most efficient for SC regulators) while the inductor switches 318 and 316 can switch at a different duty cycle (D) depending on the desired $V_{IN}$:$V_{OUT}$ ratio, as illustrated in FIG. 3C. A downside is that this architecture potentially needs a larger number of switches (and larger chip area) than other designs (such as those described in connection with FIGS. 4A-4C and FIGS. 5A-5C) because it needs separate switches for the inductors and the SC.

In some embodiments, SC regulator 312 can be a multi-phase SC regulator where multiple copies of SC regulators operate in a time-interleaved fashion. The inductor 312 and switches 318 and 316 can also be duplicated and time-interleaved (e.g., phase 0 and phase 1 operate 180 degrees out of phase). This way, the regulator can support a larger amount of current to the output (e.g., twice the current for two phases compared to one phase).

Figure 4A:
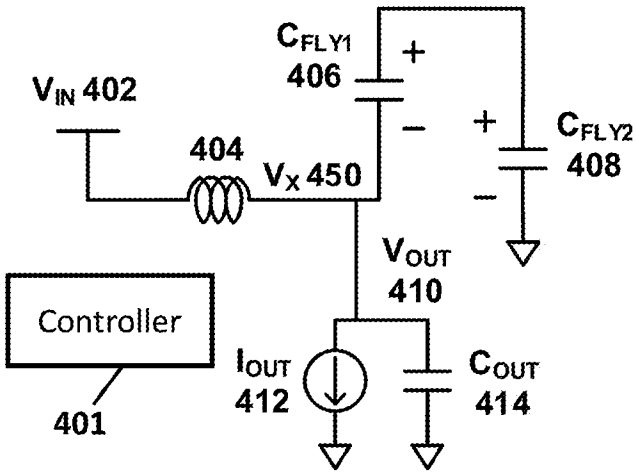
FIGS. 4A and 4B are examples of schematics (with switches omitted) of a more compact hybrid voltage regulator than the regulator of FIGS. 3A and 3B that has a H31 mode in accordance with some embodiments.
Figure 4B:
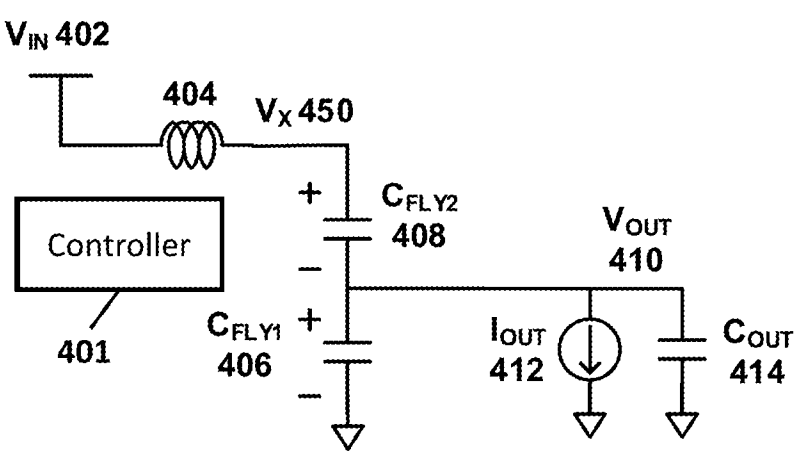
Figure 4C:
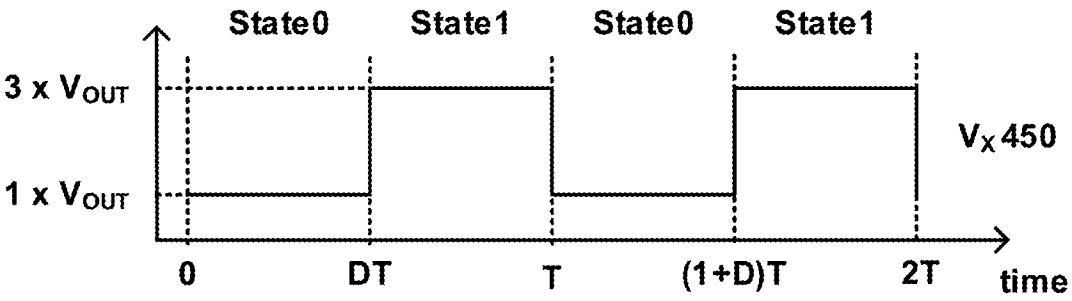
FIG. 4C is an example of a timing diagram of the hybrid voltage regulator of FIGS. 4A and 4B in accordance with some embodiments.

FIGS. 4A-4C describe an example of another H31 hybrid regulator in accordance with some embodiments. As shown, this regulator can include an inductor 404, a first flying capacitor $C_{FLY1}$ 406, a second flying capacitor $C_{FLY2}$ 408, and an output capacitor $C_{OUT}$ 414. This regulator can also include a controller 401 for controlling switches in the regulator that are not shown for clarity. An input voltage $V_{IN}$ 402 can be connected to the input of inductor 404 and an output load can be connected in parallel with $C_{OUT}$ 414. A voltage $V_X$ 450 is present at the output (or right side) of inductor 404, an output voltage $V_{OUT}$ 414 is present across output capacitor 414, and an output current $I_{OUT}$ 412 can be drawn by a load.

Inductor 404 can be any suitable inductor, such as a discrete inductor mounted on or embedded in a package or a printed circuit board (e.g., an inductor sized 0201, 0402, 0603, 0805 and so on) or a spiral inductor that can be drawn using metal layers on-chip, on-package, or on a printed circuit board. The switches not shown can be any suitable switches, such as MOSFETs. Capacitors $C_{FLY1}$ 406 and $C_{FLY2}$ 408 can be any suitable flying capacitors, such as multi-layer ceramic capacitors (e.g., sized 0201, 0402, 0603, 0805 and so on), on-chip metal-insulator-metal (MIM) or metal-on-metal (MOM) capacitors, or on-chip dense capacitors (e.g., deep trench capacitors with high-k dielectric materials). Output capacitor $C_{OUT}$ 414 can be any suitable capacitor, such as multi-layer ceramic capacitors (e.g., sized 0201, 0402, 0603, 0805 and so on), on-chip metal-insulator-metal (MIM) or metal-on-metal (MOM) capacitors, or on-chip dense capacitors (e.g., deep trench capacitors with high-k dielectric materials).

As shown in FIGS. 4A and 4B, assume that the two flying capacitors $C_{FLY1}$ and $C_{FLY2}$ are both very large, so their voltages, $V_{CFLY1}$ and $V_{CFLY2}$, stay constant. In a State 0 (FIG. 4A):

$$V_{CFLY2}=V_{OUT}+V_{CFLY1}$$

In a State 1 (FIG. 4B):

$$V_{CFLY1}=V_{OUT}$$

As a result:

$$V_{CFLY2}=2\times V_{OUT}$$

As shown in FIG. 4C, in State 0 (FIG. 4A), $V_X=3\times V_{OUT}$, and, in State 1 (FIG. 4B), $V_X=1\times V_{OUT}$. Like with FIGS. 3A-3C, $V_{IN}$ can be determined using the following equation:

$$\begin{aligned} V_{IN} &= D\times V_{OUT}+(1-D)\times 3\times V_{OUT} \\ &= 3\times V_{OUT}-2\times D\times V_{OUT} \\ &= V_{OUT}(3-2D) \end{aligned}$$

In some embodiments, this regulator can be duplicated and time-interleaved. This way, the regulator can support a larger amount of current to the output (e.g. twice the current for two phases compared to one phase).

Figure 5B:
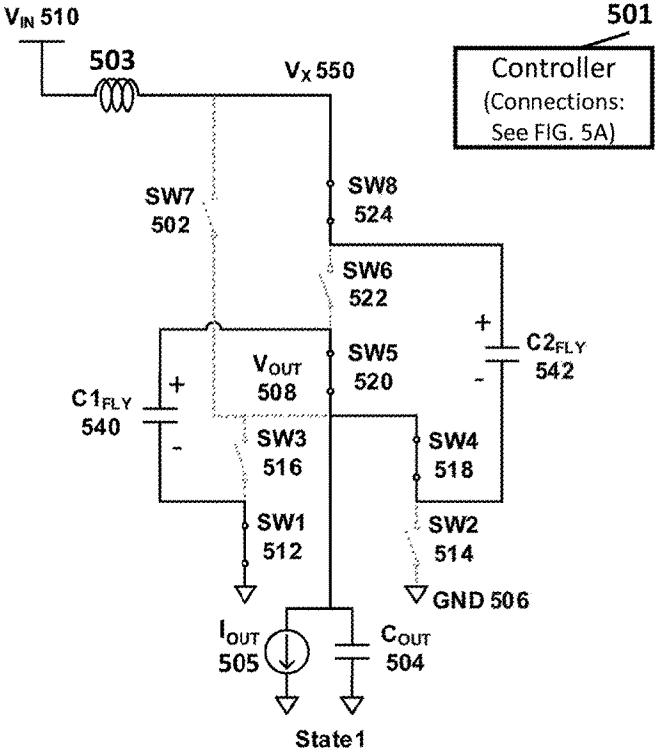
FIGS. 5A and 5B are examples of schematics of the hybrid voltage regulator of FIGS. 4A and 4B with its switches shown in accordance with some embodiments.
Figure 5A:
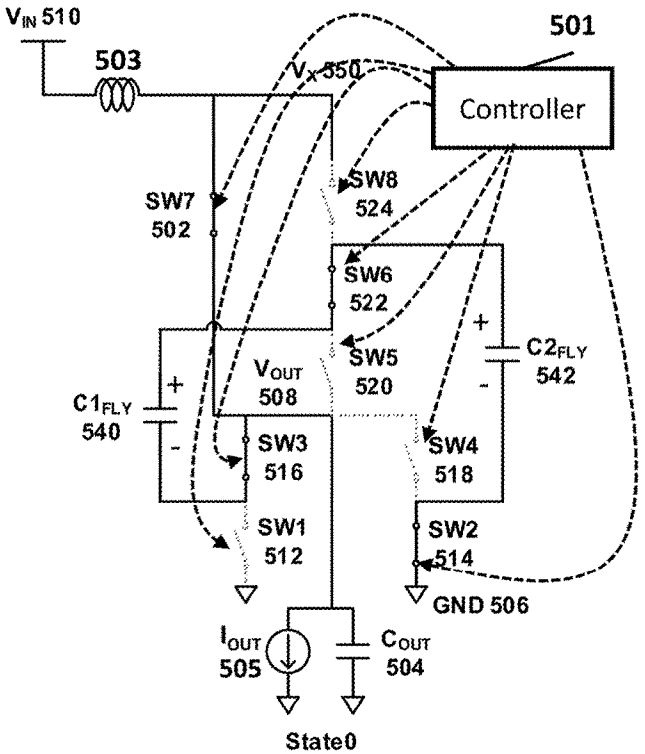
Figure 5C:
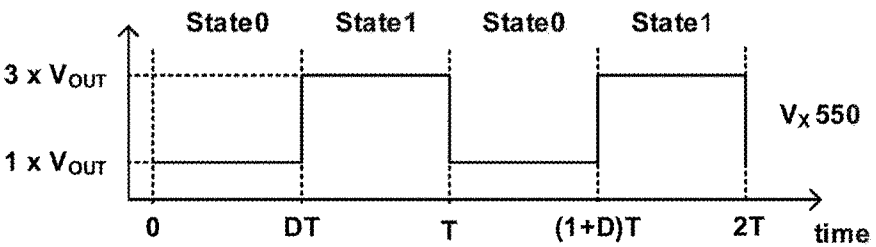
FIG. 5C is an example of a timing diagram of the hybrid voltage regulator of FIGS. 5A and 5B in accordance with some embodiments.

FIGS. 5A-5C describe a more particular example of the H31 hybrid regulator of FIGS. 4A-4C in accordance with some embodiments. As shown, this regulator can include an inductor 503, a first flying capacitor $C_{FLY1}$ 540, a second flying capacitor $C_{FLY2}$ 542, an output capacitor $C_{OUT}$ 504, and switches SW1 512, SW2 514, SW3 516, SW4 518, SW5 520, SW6 522, SW7 502, and SW8 524. This regulator can also include a controller 501 for controlling the switches. An input voltage $V_{IN}$ 510 can be connected to the input of inductor 503 and an output load can be connected in parallel with $C_{OUT}$ 504. A voltage $V_X$ 550 is present at the output (or right side) of inductor 503, an output voltage $V_{OUT}$ 508 is present across output capacitor 504, and an output current $I_{OUT}$ 505 can be drawn by a load.

Inductor 503 can be any suitable inductor, such as a discrete inductor mounted on or embedded in a package or a printed circuit board (e.g., an inductor sized 0201, 0402, 0603, 0805 and so on) or a spiral inductor that can be drawn using metal layers on-chip, on-package, or on a printed circuit board. Capacitors $C_{FLY1}$ 540 and $C_{FLY2}$ 542 can be any suitable flying capacitors, such as multi-layer ceramic capacitors (e.g., sized 0201, 0402, 0603, 0805 and so on), on-chip metal-insulator-metal (MIM) or metal-on-metal (MOM) capacitors, or on-chip dense capacitors (e.g., deep trench capacitors with high-k dielectric materials). Output capacitor $C_{OUT}$ 504 can be any suitable capacitor, such as multi-layer ceramic capacitors (e.g., sized 0201, 0402, 0603, 0805 and so on), on-chip metal-insulator-metal (MIM) or metal-on-metal (MOM) capacitors, or on-chip dense capacitors (e.g., deep trench capacitors with high-k dielectric materials). Switches SW1 512, SW2 514, SW3 516, SW4 518, SW5 520, SW6 522, SW7 502, and SW8 524 can be any suitable switches, such as MOSFETs.

FIG. 5C shows a timing diagram for the regulator of FIGS. 5A-5C. As shown, the regulator switches between a State 0 and a State 1. In State 0, switches SW1 512, SW4 518, SW5 520, and SW8 524 are open, and switches SW2 514, SW3 516, SW6 522, and SW7 502 are closed. In State 1, switches SW1 512, SW4 518, SW5 520, and SW8 524 are closed, and switches SW2 514, SW3 516, SW6 522, and SW7 502 are open.

As shown in FIGS. 5A and 5B, assume that the two flying capacitors $C_{FLY1}$ and $C_{FLY2}$ are both very large, so their voltages, $V_{CFLY1}$ and $V_{CFLY2}$, stay constant. In a State 0 (FIG. 5A):

$$V_{CFLY2}=V_{OUT}+V_{CFLY1}$$

In a State 1 (FIG. 5B):

$$V_{CFLY1}=V_{OUT}$$

As result:

$$V_{CFLY2}=2\times V_{OUT}$$

As shown in FIG. 5C, in State 0 (FIG. 5A), $V_X=3\times V_{OUT}$, and, in State 1 (FIG. 5B), $V_X=1\times V_{OUT}$. Like with FIGS. 3A-3C and 4A-4C, $V_{IN}$ can be determined using the following equation:

$$\begin{aligned} V_{IN} &= D\times V_{OUT}+(1-D)\times 3\times V_{OUT} \\ &= 3\times V_{OUT}-2\times D\times V_{OUT} \\ &= VOUT(3-2D) \end{aligned}$$

In some embodiments, this regulator can be duplicated and time-interleaved. This way, the regulator can support a larger amount of current to the output (e.g. twice the current for two phases compared to one phase).

Accordingly, mechanisms (which can include circuits and methods) for hybrid 3:1 voltage regulators are provided.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for a voltage regulator, comprising:

an inductor having a first side coupled to an input voltage and having a second side;

a first flying capacitor having a first side and having a second side;

a second flying capacitor having a first side and having a second side; and a plurality of switches[,]; *and*

*a controller that controls the plurality of switches and to switch between the first state and a second state,* wherein:

in [a] *the* first state, the plurality of switches connect:

the second side of the inductor to the second side of the first flying capacitor and an output node;

the first side of the first flying capacitor to the first side of the second flying capacitor; and the second side of the second flying capacitor to a voltage supply, in [a] *the* second state, the plurality of switches connect:

the second side of the inductor to the first side of the second flying capacitor;

the second side of the second flying capacitor to the output node and the first side of the first flying capacitor; and the second side of the first flying capacitor to the voltage supply.

2. The circuit of claim 1, wherein the voltage supply is a ground.

3. The circuit of claim 1, wherein each switch is a MOSFET.

[4. The circuit of claim 1, further comprising a controller that controls the switches to switch between the first state and the second state.]

5. The circuit of claim 1, further comprising an output capacitor *having a first side connected to the output node and a second side connected to the voltage supply.*

*6. The circuit of claim 1, wherein the inductor is a discrete inductor mounted on a printed circuit board.*

*7. The circuit of claim 1, wherein the inductor is implemented on-chip.*

*8. The circuit of claim 1, wherein at least one of the first flying capacitor and the second flying capacitor is a multilayer ceramic capacitor.*

*9. The circuit of claim 1, wherein at least one of the first flying capacitor and the second flying capacitor is an on-chip capacitor.*

*10. A regulator comprising a first circuit and a second circuit each as claimed in claim 1, wherein operation of the first circuit and the second circuit are time-interleaved with respect to each other.*

*11. A circuit for controlling connections with:*

*an inductor having a first side coupled to an input voltage and having a second side;*

*a first flying capacitor having a first side and having a second side; and*

*a second flying capacitor having a first side and having a second side,*

*the circuit comprising:*

*a plurality of switches; and*

*a controller that controls the plurality of switches to switch between a first state and a second state,*

*wherein:*

*in the first state, the plurality of switches connect:*

*the second side of the inductor to the second side of the first flying capacitor and an output node;*

*the first side of the first flying capacitor to the first side of the second flying capacitor; and*

*the second side of the second flying capacitor to a voltage supply,*

*in the second state, the plurality of switches connect:*

*the second side of the inductor to the first side of the second flying capacitor;*

*the second side of the second flying capacitor to the output node and the first side of the first flying capacitor; and*

*the second side of the first flying capacitor to the voltage supply.*

*12. The circuit of claim 11, wherein the voltage supply is a ground.*

*13. The circuit of claim 11, wherein each switch is a MOSFET.*

*14. The circuit of claim 11, wherein the output node is connected to an output capacitor having a first side connected to the output node and a second side connected to the voltage supply.*

*15. The circuit of claim 11, wherein the inductor is a discrete inductor mounted on a printed circuit board.*

*16. The circuit of claim 11, wherein the inductor is implemented on-chip.*

*17. The circuit of claim 11, wherein at least one of the first flying capacitor and the second flying capacitor is a multilayer ceramic capacitor.*

*18. The circuit of claim 11, wherein at least one of the first flying capacitor and the second flying capacitor is an on-chip capacitor.*

*19. A regulator comprising a first circuit and a second circuit each as claimed in claim 11, wherein operation of the first circuit and the second circuit are time-interleaved with respect to each other.*

*20. A circuit for connection to:*

*a first flying capacitor having a first side and having a second side; and*

*a second flying capacitor having a first side and having a second side,*

*the circuit comprising:*

*an inductor having a first side coupled to an input voltage and having a second side; and*

*a plurality of switches; and*

*a controller that controls the plurality of switches to switch between a first state and a second state,*

*wherein:*

*in the first state, the plurality of switches connect:*

*the second side of the inductor to the second side of the first flying capacitor and an output node;*

*the first side of the first flying capacitor to the first side of the second flying capacitor; and*

*the second side of the second flying capacitor to a voltage supply,*

*in the second state, the plurality of switches connect:*

*the second side of the inductor to the first side of the second flying capacitor;*

*the second side of the second flying capacitor to the output node and the first side of the first flying capacitor; and*

*the second side of the first flying capacitor to the voltage supply.*

*21. The circuit of claim 20, wherein the voltage supply is a ground.*

*22. The circuit of claim 20, wherein each switch is a MOSFET.*

*23. The circuit of claim 20, wherein the output node is connected to an output capacitor having a first side connected to the output node and a second side connected to the voltage supply.*

*24. A circuit for connection to:*

*an inductor having a first side coupled to an input voltage and having a second side, the circuit comprising:*

*a first flying capacitor having a first side and having a second side;*

*a second flying capacitor having a first side and having a second side; and*

*a plurality of switches; and*

*a controller that controls the plurality of switches to switch between a first state and a second state,*

*wherein:*

*in the first state, the plurality of switches connect:*

*the second side of the inductor to the second side of the first flying capacitor and an output node;*

*the first side of the first flying capacitor to the first side of the second flying capacitor; and*

*the second side of the second flying capacitor to a voltage supply,*

*in the second state, the plurality of switches connect:*

*the second side of the inductor to the first side of the second flying capacitor;*

*the second side of the second flying capacitor to the output node and the first side of the first flying capacitor; and*

*the second side of the first flying capacitor to the voltage supply.*

*25. The circuit of claim 24, wherein the voltage supply is a ground.*

*26. The circuit of claim 24, wherein each switch is a MOSFET.*

*27. The circuit of claim 24, wherein the output node is connected to an output capacitor having a first side connected to the output node and a second side connected to the voltage supply.*

* * * * *